United States Patent
Huang

[11] Patent Number: 6,060,721
[45] Date of Patent: May 9, 2000

[54] APPARATUS FOR DETECTING CORRECT POSITIONING OF A WAFER CASSETTE

[75] Inventor: Yu Chih Huang, Taichung, Taiwan

[73] Assignee: Taiwan Semiconductor Manufacturing Co., Ltd, Hsin-Chu, Taiwan

[21] Appl. No.: 09/073,638

[22] Filed: May 6, 1998

[51] Int. Cl.[7] .................................................. G01N 21/86
[52] U.S. Cl. ................................ 250/559.4; 250/559.49; 250/559.33; 356/375; 414/937
[58] Field of Search ........................... 250/559.4, 559.49, 250/559.37, 559.3, 559.33, 222.1; 356/375, 401; 414/937–940, 936

[56] References Cited

U.S. PATENT DOCUMENTS

| | | | |
|---|---|---|---|
| 4,778,382 | 10/1988 | Sakashita | 414/936 |
| 5,857,827 | 1/1999 | Asakawa et al. | 414/779 |

*Primary Examiner*—Que T. Le
*Attorney, Agent, or Firm*—Tung & Associates

[57] ABSTRACT

A mechanical indicator assembly mounted on a cassette stage in a semiconductor processing system is mechanically actuated when a wafer carrying cassette is correctly positioned onto the stage. The indicator assembly includes a pin engaged by the cassette which moves a lever mounted reflector to a position indicating that the cassette is correctly positioned. An electro-optical assembly disposed entirely outside a housing surrounding the stage, directs a light beam toward the reflector, and senses reflected light indicative of correct positioning of the cassette on the stage.

18 Claims, 3 Drawing Sheets

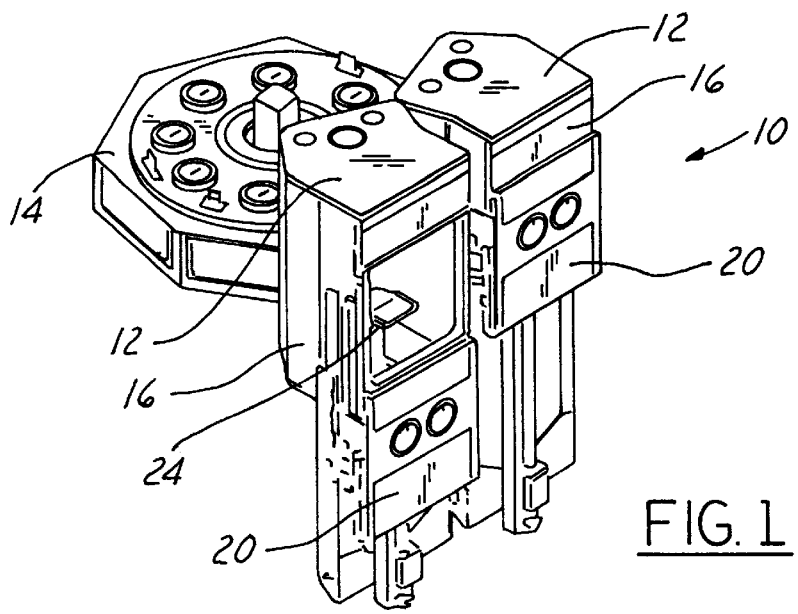
FIG. 1
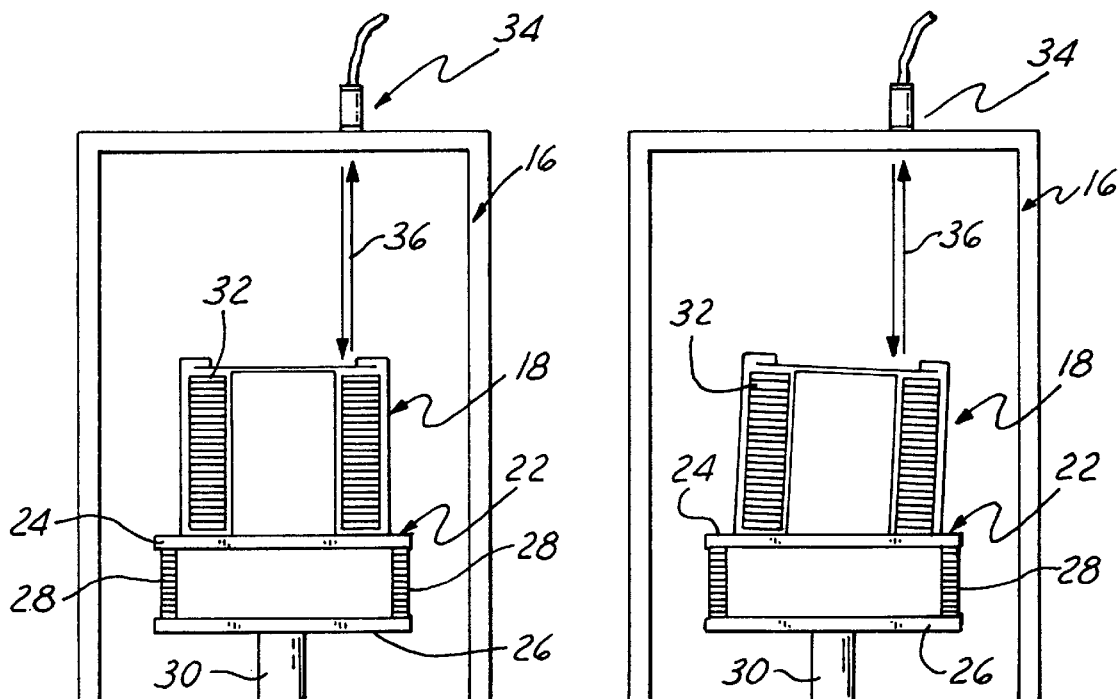
(PRIOR ART)
FIG. 2
(PRIOR ART)
FIG. 3

APPARATUS FOR DETECTING CORRECT POSITIONING OF A WAFER CASSETTE

TECHNICAL FIELD

The present invention generally relates to carriers for holding a plurality of semiconductor wafers, and deals more particularly with apparatus for detecting the presence and correct positioning for orientation of a wafer-carrying cassette in a chamber or housing forming part of a semiconductor processing system.

BACKGROUND OF THE INVENTION

Systems for processing semiconductor wafers typically process the wafers in loads or batches to maximize efficiency and throughput. Each batch of the wafers is mounted on a single, portable carrier, sometimes referred to as a cassette, wherein the wafers are effectively disposed in a stacked arrangement. After the wafers are loaded into the cassette, the cassette is placed on a platform-like, cassette stage within an enclosed housing referred to as a load lock chamber. After the cassette is installed in the chamber, a loading door of the chamber is closed and a vacuum is drawn within the chamber, at which point the wafers are ready to undergo processing. Typically, the wafers are then serially removed from the cassette and transferred to other chambers for appropriate processing.

After closing the load lock chamber loading door, it is not readily apparent to the human operator whether a cassette is present in a particularly chamber. Therefore, means have been devised in the past for sensing the presence of a cassette within the chamber. One form of known sensor comprises an optically based sensor which includes portions that extend into the interior of the chamber, in close proximity to the top surface of the cassette. This sensing arrangement merely detects whether a cassette is present, but does not provide any information as to the orientation or position of the cassette on the cassette stage. In some cases, the cassettes are sometimes placed upon the cassette stage such that the cassette is cocked or tilted slightly, i.e., the longitudinal axis of the cassette is not vertically aligned. Cassettes which are placed on the stage so as to be off axis can result in misfeeding or jamming of the transfer mechanism which serially removes the wafers from the cassette. Misfeeding or jamming naturally results in down time of the system, and thus less throughput, and can even reduce yield where wafers are damaged as a result of the jamming.

The prior art wafer sensing arrangement is also undesirable because of the intrusion of the optical sensor deep into the load lock chamber. The sensor is not only exposed to the atmosphere within the chamber, but is subject to damage or breakage since it tends to interfere with the installation or removal of a cassette within the chamber.

The present invention is intended to overcome each of the deficiencies of the prior art discussed above.

Accordingly, it is a primary object of the present invention to provide apparatus for detecting the presence and correct orientation of a wafer carrying cassette on a support surface within a cassette housing forming part of a semiconductor processing system.

A further object of the present invention is to provide apparatus as described above, which assures axial alignment of the cassette within the cassette housing, thereby preventing misfeeding or jamming of feed mechanisms which transfer wafers from the cassette to downstream processing stations.

A still further object of the present invention to provide apparatus as described above, which obviates the need for mounting sensing electronics within the housing.

Another object of the invention is to provide apparatus as aforesaid, which employs a simple, very reliable mechanical assembly for sensing whether the cassette is properly oriented on a support surface.

These, and further objects of the invention will be made clear or will become apparent during the course of the following description of a preferred embodiment chosen to illustrate the invention.

SUMMARY OF THE INVENTION

According to one aspect of the invention, apparatus is provided for detecting the presence and correct orientation of wafer carrying cassette on a support surface disposed within a cassette housing employed in a semiconductor processing system. The apparatus includes a movable element positioned to be contacted and shifted by the cassette when the cassette is placed in a correct orientation within the housing. The movable element is mounted on one end of a pivotal arm, the opposite end of the arm carrying indicator means thereon, which indicator means is displaceable upon pivoting of the arm to a preselected position indicating that the cassette is correctly oriented on the support surface. The apparatus further includes means for detecting when the indicator means is in the preselected position thereof.

According to another aspect of the invention, apparatus is provided for detecting the presence of a wafer carrying cassette on a support surface, such as a cassette stage, within a cassette housing, which comprises a shiftable assembly disposed within the housing and engageable by the cassette when the cassette is present in the housing. The assembly is shiftable between a first position when the cassette is present in the housing, and a second position when the cassette is absent from the housing. The apparatus further includes means for detecting when the shiftable assembly is in the first position thereof.

According to a third aspect of the invention, apparatus is provided for detecting the presence and correct orientation of a wafer carrier on a carrier stage within a housing forming part of a semiconductor processing system. The apparatus includes a mechanical indicator disposed within the housing for providing an indication when the carrier is present in a correct position thereof on the carrier stage. Electro-optical means disposed outside of the housing detects when the indicator is providing an indication that the carrier is installed in its correct position within the housing.

The indicator preferably comprises a reflector mounted on one end of the lever arm, and the arm is preferably pivotably mounted on the bottom of the support surface or cassette stage.

The detecting means preferably comprises means for directing a focus beam of light through an opening in the sidewall of the housing, toward the general direction of the reflector, and a light sensitive pick up for detecting light reflected from the reflector indicating that the cassette is properly positioned on the support surface.

BRIEF DESCRIPTION OF THE DRAWINGS

In the drawings, wherein like reference numerals are employed to designated identical components and the various views, and which form an integral part of the present specification:

FIG. 1 is a perspective view of a typical loading, unloading and transfer mechanism forming part of a typical semiconductor processing system;

FIG. 2 is a cross-sectional view of the load lock chamber shown in FIG. 1, employing a prior art cassette detector, and showing the cassette in its correct, vertically aligned position;

FIG. 3 is a view similar to FIG. 2, but showing the cassette in a tilted, out of alignment position;

DESCRIPTION OF THE PREFERRED EMBODIMENTS

Figure 4:
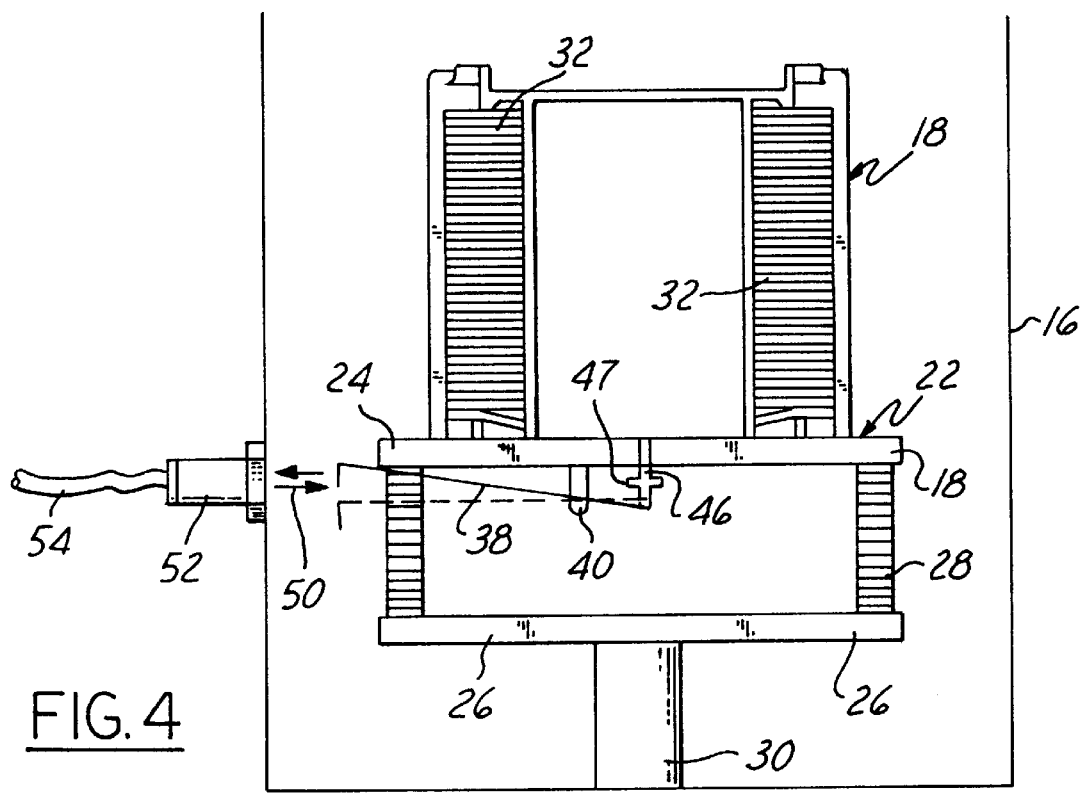
FIG. 4 is a cross-sectional view of the load lock chamber shown in FIG. 1, but depicting the preferred embodiment of the present invention.

Referring first to FIG. 1, the present invention generally relates to improvements in apparatus 10 for loading and unloading semiconductor wafers for subsequent processing in a semiconductor processing operation. The apparatus 10 comprises a pair of load lock chambers 12, each of which includes a housing 16 having an opening in a sidewall thereof which may be covered by a slidable closure or loading door 20. Each chamber 12 is adapted to receive a later discussed cassette 18 containing a plurality of stacked semiconductor wafers. Each chamber is connected with a system (not shown) which draws a vacuum therein in the chamber. A transfer chamber 14 serially transfers wafers away from, or into the cassette 18 for processing in downstream stations.

As shown in FIG. 2, the cassette 18 containing a plurality of stacked semiconductor wafers 32 rests upon a cassette stage which comprises an upper plate 24 defining an upper surface 22 upon which the cassette 18 rests. The plate 24 is mounted by four spaced apart springs 28 on a base plate 26 which is in turn supported above the bottom of the housing 16 by means of a central mounting post 30. FIG. 2 shows the cassette as being properly positioned and vertically aligned on the stage, i.e., the central longitudinal axis of the cassette 18 is essentially vertical, and the bottom of the cassette 18 rests in a preselected on the upper surface 22 of the upper plate 24. The presence of the cassette 18 on the stage is detected by means of a prior art electro-optical assembly comprising a detector tube 36 which extends through the top wall of the housing 16, downwardly to a point immediately above the cassette 18. Another portion of the sensor which includes a light source 34 is mounted on the top wall of the housing 16, outside of the interior of the chamber.

As will become apparent later herein, the bottom of the cassette 18 is specially configured to nest within raised lands or guide blocks, which help assure proper positioning of the cassette 18 on the stage. However, in spite of this alignment said, the cassette 18 is sometimes incorrectly placed upon the upper plate 24 such that proper nesting is not achieved, with the result that the cassette 18 rests in a tilted position, with its longitudinal axis not vertically oriented, as is shown in FIG. 3. While the sensor 34, 36 is able to sense the presence of the cassette 18 within the housing 16, it is not capable of detecting when the cassette 18 is properly nested and vertically aligned. In some cases, the optical tube 36 may actually interfere with the installation of the cassette 18 onto the stage, thereby contributing mispositioning of the cassette 18 on the stage.

Figure 5:
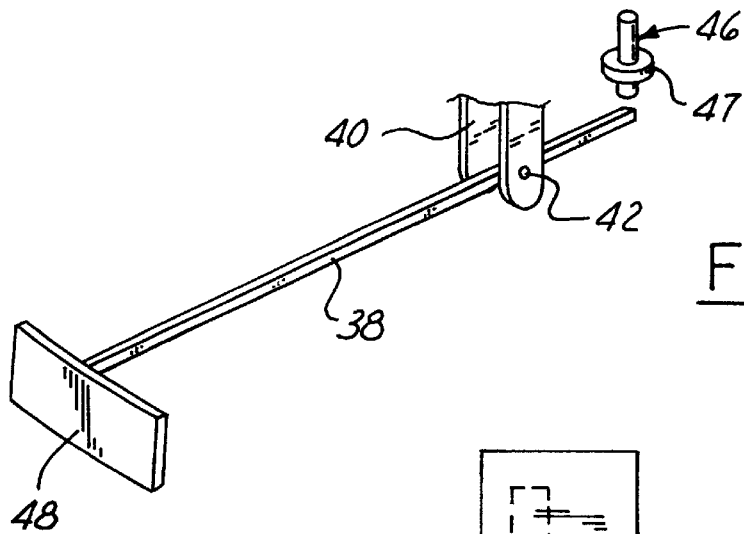
FIG. 5 is a perspective view of a shiftable assembly for detecting the presence and correct orientation of a cassette which forms part of the preferred embodiment shown in FIG. 4.

Referring now to FIGS. 5–8, inclusive, proper nesting of the cassette 18 on the stage is assured by the present invention through the use of a shiftable mechanical indicator assembly, whose primary components are best seen in FIG. 5. The assembly comprises a vertically shiftable pin 46, a lever arm 38, a generally rectangular, light reflector 48, and a pair of spaced apart ears 40 and axial pin 42 which pivotably mount the lever arm 38 on the bottom side of plate 24. The upper section of pin 46 extends through a central opening or through hole in plate 24, and is adapted to be engaged by the bottom of the cassette 18. The opposite, or bottom end of the pin 46 engages one end of the lever arm 38, and under the weight of the cassette 18, causes the lever arm to pivot about pin 42, thereby shifting the vertical position of the reflector 48 which is mounted on the opposite end of arm 38. An annular stop 47 on the pin 46 engages the bottom surface of the plate 24, and thus limits the upward movement of the pin 46.

Figure 6:
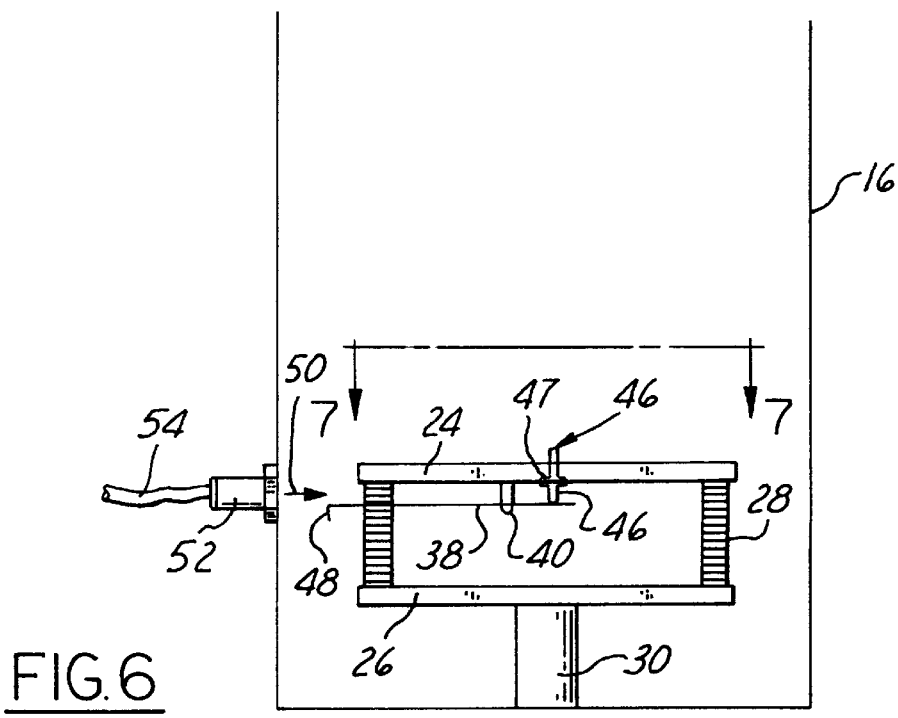
FIG. 6 is a view similar to FIG. 4, but with the cassette having been removed from the housing.
Figure 7:
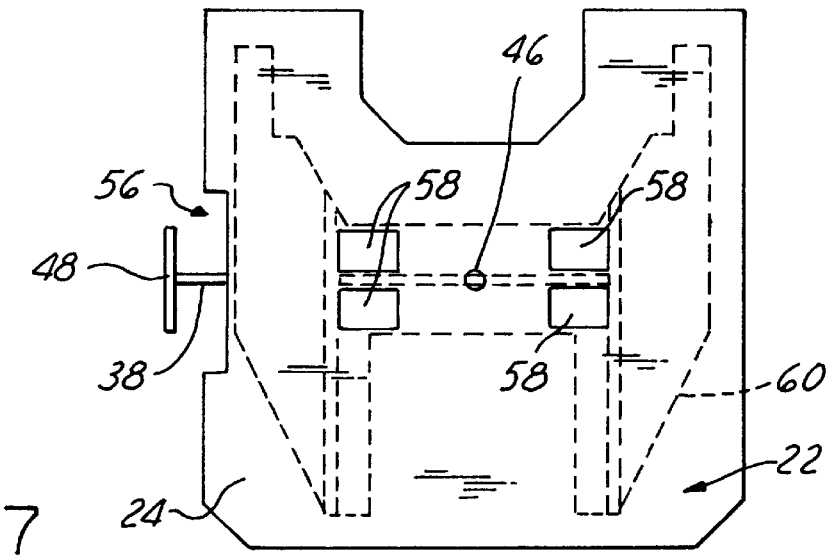
FIG. 7 is a view taken in the direction of the arrows 7—7 in FIG. 6, an overlay of the bottom of the cassette being indicated in the phantom.
Figure 8:
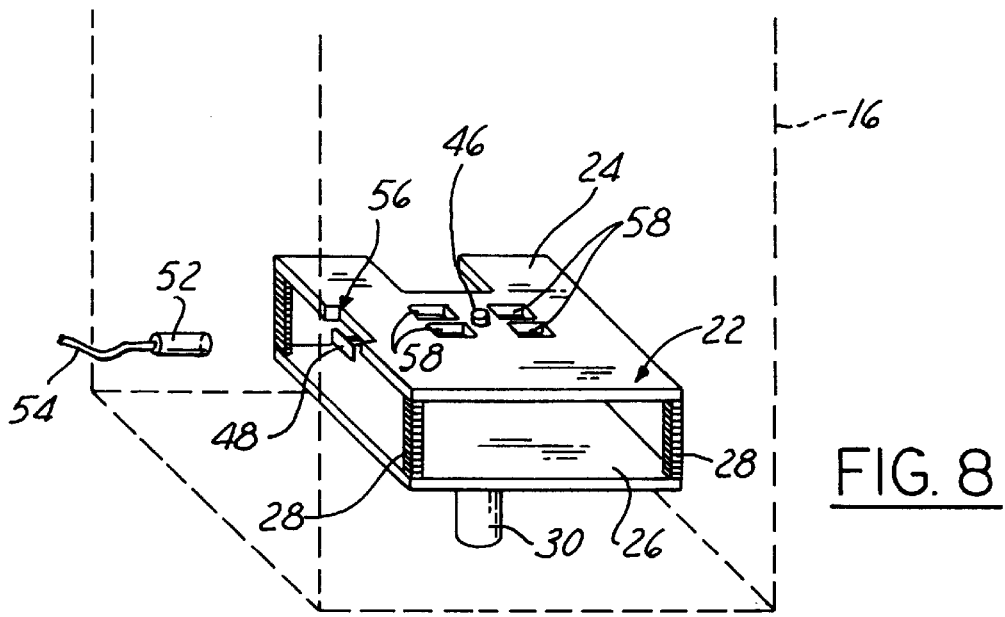
FIG. 8 is a perspective view of the cassette stage with the preferred embodiment of the invention installed thereon, wherein the chamber housing is indicated in the phantom.

As best seen in FIGS. 6–8, the lever arm 38 extends transversely, toward one side of the housing, with the reflector 48 extending slightly beyond one side of the cassette stage. A cut out 56 (FIGS. 7 and 8) is provided along one edge of the top plate 24 to provide vertical clearance which allows the reflector 48 to move upwardly, into the plane of the plate 24. The previously discussed lands or guide blocks 58 are shown in FIG. 7, in relationship to the overlying structure of the bottom of the cassette 18 (shown in the phantom and designated by the numeral 60) which nests with the guide block 58 so as to fix the cassette in a preselected, aligned orientation on the stage. FIG. 7 also depicts the through hole 49 through which the pin 46 extends.

The housing 16 is provided with a second through hole in the sidewall thereof, at which position an electro-optical assembly is mounted, comprising a combined light beam source and photo sensor 52 coupled by line 54 to a controller (not shown). The electro-optical assembly 52 delivers a focus beam of light 50, horizontally toward the cassette stage such that when the reflector 48 is horizontally aligned with the light beam, light is reflected from the reflector 48 back toward the sensor pick up forming part of the assembly 52.

Referring momentarily to FIG. 4, when the cassette 18 is properly positioned on the stage, in nesting relationship to the alignment blocks 58, a portion of the bottom structure of the cassette 18 impinges upon the pin 46, and under the weight of the cassette 18, the pin 46 is displaced downwardly, in turn applying a force to one end of the arm 38 which causes the latter to pivot the reflector 48 upwardly into horizontal alignment with the light beam 50. With the reflector 48 horizontally aligned with the light beam 50, the electro-optical assembly 52 detects the presence of the reflector 48, thus generating an indication that the cassette 18 is properly positioned on the stage. In the event that the cassette 18 is improperly placed on the stage such that the cassette is not properly nested within the alignment lock 58, then the pin 46 will not be completely displaced downwardly, as it is when the cassette 18 is in its correct position, and thus reflector 48 is not positioned to reflect light back to the assembly 52.

When the cassette 18 is removed from the housing 16, the weight of the reflector 48 combined with the length of the moment arm forces the pin 46 upwardly until the stop 47 engages the bottom surface of the top plate 24.

The mechanical indicator described above is highly reliable and not subject to providing false indications that the cassette 18 is properly positioned on the cassette stage. Moreover, the electro-optical assembly 52 does not intrude into the interior of the chamber, and is positioned beneath the level of the cassette 18, in close proximity to the reflector 48, thus providing a highly reliable sensing arrangement which does not rely on direct sensing of any features of the cassette 18.

From the foregoing, it is apparent that the present invention not only provides for the accomplishment of the objects of the invention, but does so in a particularly simple, economical manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

While the present invention has been described in an illustrative manner, it should be understood that the terminology used is intended to be in a nature of words of description rather than of limitation.

Furthermore, while the present invention has been described in terms of a preferred and an alternate embodiments, it is to be appreciated that those skilled in the art will readily apply these teachings to other possible variations of the inventions.

The embodiment of the invention in which an exclusive property or privilege is claimed are defined as follows:

1. For use in a semiconductor processing system, apparatus for detecting the presence and correct orientation of a wafer carrying cassette on a support surface within a cassette housing, comprising:

a movable element positioned to be contacted and shifted by said cassette when said cassette is placed in a correct orientation within said housing;

a pivotal arm having said movable element on one end thereof;

indicator means carried on the other end of said arm, said indicator means being displaceable upon pivoting of said arm to a preselected position indicating that said cassette is in said correct orientation thereof, wherein said pivotal arm includes a reflector for reflecting light toward a sensor when said cassette is in said correct orientation; and means for detecting when said indicator means is in said preselected position thereof.

2. The apparatus of claim 1, wherein said movable element is positioned to contact the bottom of said cassette, and said arm is pivotal about a transverse axis intermediate the opposite ends of said arm.

3. The apparatus of claim 1, wherein:

said indicator means includes means for reflecting light, and said detecting means includes means for directing light toward said reflecting means, and means for sensing light reflected from said reflecting means.

4. The apparatus of claim 1, wherein:

said arm indicator means are disposed within said housing, and said detecting means includes a sensor disposed outside of said housing.

5. The apparatus of claim 4, wherein:

said indicator means includes a reflector, said housing is provided with an opening therein, and said detecting means includes means for directing a light beam through said housing opening toward said reflector, said light directing means and reflector being relatively positioned such that when said cassette is in said correct orientation thereof light from said beam is reflected by said reflector toward said sensor.

6. The apparatus of claim 5, wherein said housing opening is defined in a vertical side wall of said housing and said reflected light is reflected essentially horizontally through said sidewall opening.

7. The apparatus of claim 1, including means for pivotally mounting said pivotal arm on the bottom side of said support surface.

8. The apparatus of claim 1, wherein:

said support surface includes a vertically oriented through-hole therein, and said movable element includes a pin extending and vertically shiftable through said through hole.

9. The apparatus of claim 8, wherein said pin includes a stop thereon, said stop limiting the upward vertical movement of said pin within said through hole.

10. For use in a semiconductor processing system, apparatus for detecting the presence of a wafer-carrying cassette on a support surface within a cassette housing, comprising:

a shiftable assembly within said housing and engageable by said cassette when said cassette is present in said housing, said assembly being shiftable between a first position when said cassette is present in said housing, and a second position when said cassette is absent from said housing, said shiftable assembly includes a reflector for reflecting light toward said sensor when said assembly is in said first position thereof; and means for detecting when said shiftable assembly is in said first position thereof, said detecting means includes means external of said housing for directing light through said housing toward said shiftable assembly, and for sensing light reflected from said assembly.

11. The apparatus of claim 10, wherein said shiftable assembly includes:

a lever arm positioned beneath said support surface and having said reflector being mounted on one end thereof, a pin on the other end of said arm and engageable by said cassette, means for mounting said lever arm for pivotal movement between two positions, whereby in one of said two positions, said reflector reflects light toward said sensor indicating that said cassette is present in said housing.

12. The apparatus of claim 11, including:

a first through hole opening in said support surface, said pin extending through said through hole and engageable with said cassette, a second through hole opening in said housing through which light from said reflector may pass toward said sensor.

13. The apparatus of claim 12, wherein said support surface includes a cut-out section along the periphery thereof and said reflector is at least partially disposed in said cut-out section when shiftable assembly is in said first position thereof.

14. For use in a semiconductor processing system, apparatus for detecting the presence and correct orientation of a wafer carrier on a carrier stage within a housing, comprising:

a mechanical indicator disposed within said housing for providing an indication when said carrier is present in a correct position on said carrier stage, said mechanical indicator includes:

a lever arm, means on one end of said lever arm engageable with said carrier and transmitting force from said carrier to one end of said lever arm, means for pivotally mounting said lever arm intermediate the opposite ends thereof, light reflecting means on the other end of said arm, said reflecting means being shiftable between a first position indicating that said carrier is in said correct position thereof, and a second position indicating that said carrier is not in said correct position thereof, and electro-optical means disposed outside said housing for detecting when said indicator is providing an indication that said carrier is present said correction position thereof.

15. The apparatus of claim 14, wherein said mechanical indicator is disposed below said wafer carrier.

16. The apparatus of claim 14, wherein said mechanical indicator is mounted on a bottom surface of said stage.

17. The apparatus for claim 14, wherein said electro-optical means includes:

means for directing a beam of light through said housing toward said mechanical indicator, said light beam being reflected by said reflector when said reflector is in said first position thereof, and means for sensing the light reflected by said reflector.

18. The apparatus of claim 17, wherein:

said engageable means is vertically shiftable along an essentially vertical axis, and said light beam directing means is disposed on the side of said housing and said light beam is directed along an essentially horizontal axis through said housing.

* * * * *